(12) United States Patent
Li et al.

(10) Patent No.: US 9,570,491 B2
(45) Date of Patent: Feb. 14, 2017

(54) DUAL-MODE IMAGE SENSOR WITH A SIGNAL-SEPARATING COLOR FILTER ARRAY, AND METHOD FOR SAME

(71) Applicant: OmniVision Technologies, Inc., Santa Clara, CA (US)

(72) Inventors: Jin Li, San Jose, CA (US); Qian Yin, Milpitas, CA (US); Dyson Hsinchih Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/510,025

(22) Filed: Oct. 8, 2014

(65) Prior Publication Data
US 2016/0104735 A1    Apr. 14, 2016

(51) Int. Cl.
*H01L 31/0232* (2014.01)
*H01L 27/148* (2006.01)
(Continued)

(52) U.S. Cl.
CPC ......... *H01L 27/14621* (2013.01); *G02B 5/201* (2013.01); *G02B 5/208* (2013.01);
(Continued)

(58) Field of Classification Search
CPC ............... H01L 27/14621; H01L 27/14647; H01L 27/14649; H01L 27/14685; H01L 27/14689; G02B 5/201; G02B 5/208
(Continued)

(56) References Cited

U.S. PATENT DOCUMENTS

| 4,239,842 A | 12/1980 | Sandhu |
| 4,565,756 A | 1/1986 | Needs et al. |

(Continued)

FOREIGN PATENT DOCUMENTS

| TW | 201310137 A | 3/2013 |
| WO | 2014084147 | 6/2014 |

(Continued)

OTHER PUBLICATIONS

Lazarev, Grigory, et al., "LCOS Spatial Light Modulators: Trends and Applications," Optical Imaging and Metrology: Advance Technologies, First Edition, pp. 1-29, 2012.
(Continued)

*Primary Examiner* — Dzung Tran
(74) *Attorney, Agent, or Firm* — Lathrop & Gage LLP

(57) ABSTRACT

A dual-mode image sensor with a signal-separating CFA includes a substrate including a plurality of photodiode regions and a plurality of tall spectral filters having a uniform first height and for transmitting a first electromagnetic wavelength range. Each of the tall spectral filters is disposed on the substrate and aligned with a respective photodiode region. The image sensor also includes a plurality of short spectral filters for transmitting one or more spectral bands within a second electromagnetic wavelength range. Each of the short spectral filters is disposed on the substrate and aligned with a respective photodiode region. The image sensor also includes a plurality of single-layer blocking filters for blocking the first electromagnetic wavelength range. Each single-layer blocking filter is disposed on a respective short spectral filter. Each single-layer blocking filter and its respective short spectral filter have a combined height substantially equal to the first height.

11 Claims, 11 Drawing Sheets

(51) Int. Cl.

| | | |
|---|---|---|
| *H01L 31/062* | (2012.01) | |
| *H01L 21/02* | (2006.01) | |
| *H01L 27/146* | (2006.01) | |
| *G02B 5/20* | (2006.01) | |

(52) U.S. Cl.
CPC .. *H01L 27/14647* (2013.01); *H01L 27/14649* (2013.01); *H01L 27/14685* (2013.01); *H01L 27/14689* (2013.01)

(58) Field of Classification Search
USPC ..... 257/214, 294, 432, 411, E21.28; 438/73; 348/164; 359/359
See application file for complete search history.

(56) References Cited

U.S. PATENT DOCUMENTS

| | | | |
|---|---|---|---|
| 5,059,500 A | 10/1991 | Needham et al. | |
| 5,268,245 A | 12/1993 | Chiulli | |
| 5,321,249 A | 6/1994 | Nomura | |
| 5,807,511 A | 9/1998 | Kunimatsu et al. | |
| 6,004,704 A | 12/1999 | Ko | |
| 6,191,884 B1 | 2/2001 | Takizawa et al. | |
| 8,408,821 B2 | 4/2013 | Wu et al. | |
| 8,619,143 B2 | 12/2013 | Motta | |
| 2006/0043519 A1* | 3/2006 | Ezaki | H01L 27/14603 257/461 |
| 2007/0001094 A1* | 1/2007 | Rhodes | H01L 27/14621 250/208.1 |
| 2007/0272836 A1* | 11/2007 | Higashitsutsumi et al. | G01J 3/36 250/226 |
| 2009/0128672 A1* | 5/2009 | Watanabe | G02B 5/201 348/273 |
| 2009/0159799 A1* | 6/2009 | Copeland et al. | G01J 3/36 250/338.1 |
| 2009/0215220 A1* | 8/2009 | Toda | H01L 27/14603 438/87 |
| 2010/0013907 A1* | 1/2010 | Lee | H01L 27/1469 348/46 |
| 2010/0289885 A1 | 11/2010 | Lu et al. | |
| 2011/0013055 A1 | 1/2011 | Sul et al. | |
| 2011/0128423 A1 | 6/2011 | Lee et al. | |
| 2012/0056073 A1 | 3/2012 | Ahn | |
| 2012/0087645 A1* | 4/2012 | Wu et al. | H04N 5/33 396/439 |
| 2014/0117203 A1 | 5/2014 | Lin et al. | |
| 2014/0168576 A1 | 6/2014 | Lee | |

FOREIGN PATENT DOCUMENTS

| | | |
|---|---|---|
| WO | 2014103628 | 7/2014 |
| WO | 2014104136 | 7/2014 |
| WO | 2014104137 | 7/2014 |

OTHER PUBLICATIONS

Bleha, William R, et al. "Advances in Liquid Crystal on Silicon (LCOS) Spatial Light Modulator Technology," Display Technologies and Applications for Defense, SPIE vol. 8736, 87360A, 2013.
Lukac, et al., "Color Filter Arrays: Design and Performance Analysis," IEEE Transactions on Consumer Electronics, vol. 51, No. 4, pp. 1260-1267, Nov. 2005.
OmniVision's Image Sensors Bring Computer Vision to Google's Project Tango, website: http://www.prnewswire.com/news-releases/omnivisions-image-sensors-bring-computer-vision-to-googles-project-tango-247126451.html, Feb. 25, 2014.
OmniVision Products, OV4682 RGB IR, Color CMOS 4-megapixel (2688×1520) Image Sensor with OmnBSI-2 Technology, Website http://www.ovt.com/products/sensor.php?id=145, 2011.
Langfelder, G. "CMOS Pixels Directly Sensitive to Both Visible and Near-Infrared Radiation," Electron Devices, IEEE Transactions vol. 60, No. 5, pp. 1695-1700, May 2013.
Kawada, S., et al., "A wide dynamic range checkered-color CMOS image sensor with IR-Cut RGB and visible-to-near-IR pixels," IEEE Sensors Conference, pp. 1648-1651, 2009.
Koyama, S., et al., "A day and night vision mos imager with robust photonic-crystal-based RGB-and-IR," IEEE Tran. on Electron Devices, vol. 55, No. 33, pp. 754-759, Mar. 2008.
Miller, Harris R, "Color filter array for CCD and CMOS image sensors using a chemically amplified thermally cured pre-dyed positive-tone photoresist for 365-nm lithography", Proc. SPIE vol. 3678, Advances in Resist Technology and Processing XVI, 1083, pp. 383-390, Mar. 1999.
Yanof, Arnold W., et al. "Production metrology and control of color filter array photolithography for CMOS imagers", Metrology, Inspection, and Process Control for Microlithography XIII, Proc. SPIE vol. 3677, pp. 326-337, Jun. 14, 1999.
Fan, B., et al., "Ion-assisted deposition of TiO2/SiO2 multilayers for mass production," Applied Optics, vol. 45, No. 7, pp. 1461-1464, Mar. 1, 2006.
Lu, et al., "Designing color filter arrays for the joint capture of visible and near-infrared images," in ICIP, pp. 3797-3800, 2009.
Shih, Wu-Sheng, et al. "A Planarization Process for Multi-Layer Lithography Applications," Advances in Resist Technologies and Processing XXI, Proceedings of SPIE vol. 5376, pp. 664-672, 2004.
English translation of the First Office Action corresponding to Taiwanese Patent Application No. 104133236, mailed Jun. 2, 2016, 4 pages.
European Patent Application No. 15189019.1 Extended European Search Report dated Jul. 13, 2016, 11 pages.

* cited by examiner

DUAL-MODE IMAGE SENSOR WITH A SIGNAL-SEPARATING COLOR FILTER ARRAY, AND METHOD FOR SAME

TECHNICAL FIELD

This disclosure relates to dual-mode image sensors and, in particular, to visible-infrared (VIS-IR) image sensors in which image quality degradation caused by IR contamination is substantially reduced or eliminated.

BACKGROUND

Dual-mode VIS-IR complementary metal-oxide-semiconductor (CMOS) image sensors combine color and near-IR imaging capabilities into a single sensor. Using a dual-mode image sensor is more economical and space-efficient than using two single-mode sensors to independently capture color and IR images. Applications of VIS-IR image sensors include gesture recognition, depth analysis, iris detection and eye tracking.

A conventional color image sensor includes a pixel array, wherein each pixel includes a microlens to focus light on it and a spectral filter embedded beneath the pixel's microlens. The spectral filter is designed to transmit a specified range or ranges of visible electromagnetic radiation to its associated underlying pixel. For example, visible spectral filters based on primary colors have pass bands corresponding to the red, green, or blue (RGB) region of the electromagnetic spectrum. Visible spectral filters based on secondary colors have pass bands corresponding to combinations of primary colors, resulting in filters that transmit either cyan, magenta, or yellow (CMY) light. Since the transmission spectrum of a pixel's spectral filter distinguishes it from its neighboring pixels, a pixel is referred to by its filter type, for example, a "red pixel" includes a red filter. Herein, the transmission of a pixel refers to the transmission spectrum of its spectral filter.

FIG. 1 shows representative transmission spectra of visible and IR spectral filters used in CMOS image sensors. Transmission spectra 145, 155, and 165 have peak transmission in the blue, green, and red regions of the electromagnetic spectrum, respectively. Accordingly, transmission spectra 145, 155, and 165 are representative of the spectral sensitivity of blue, green, and red pixels, respectively, of both conventional color image sensors and VIS-IR image sensors.

Herein the terms "IR light," "IR electromagnetic radiation," and "IR wavelengths" refer to electromagnetic energy at wavelengths between $\lambda \approx 0.75$ μm and $\lambda \approx 1.1$ μm. The upper limit of $\lambda \approx 1.1$ μm corresponds to the band gap energy of the silicon in CMOS image sensors. Similarly, the terms "visible light," "visible electromagnetic radiation," and "visible wavelengths" refer to electromagnetic energy at wavelengths between 0.40 μm and 0.75 μm.

Visible spectral filters used in CMOS image sensors also transmit IR wavelengths, which results in image distortion known as "IR contamination." For example, absent green light incident on a pixel with a "perfect" green filter (non-zero transmission for green light only), the pixel produces no photocurrent beyond its dark current. However, a typical green filter associated with a green pixel has a transmission spectrum similar to transmission spectrum 155, FIG. 1. Within the visible spectrum, transmission spectrum 155 has a peak transmission near $\lambda \approx 550$ nm, corresponding to green light. Since the transmission spectrum 155 exceeds 80% above $\lambda \approx 800$ nm, the green pixel will produce a photocurrent in response to incident IR light, which results in IR contamination. To prevent such distortion, the conventional color image sensor also includes a single continuous IR-cut filter, or IR-blocking filter, disposed across the entire pixel array.

VIS-IR image sensors include both visible spectral filters and IR spectral filters—the latter having a transmission spectrum similar to transmission spectrum 191. Since devices employing VIS-IR image sensors depend on detecting IR wavelengths, a single continuous IR-cut filter covering the entire pixel array cannot be used in VIS-IR sensors as they are for color image sensors. Since transmission spectra 145, 155, and 165 have significant transmission in the IR region, removing IR contamination requires pixel-level filtering: where an IR-cut filter operates only on color pixels while not impeding IR light from reaching IR pixels.

FIG. 2 is a cross-sectional view of a representative prior-art VIS-IR image sensor 200 with reduced IR contamination. FIG. 2 is adapted from Kawada et al, IEEE Conf. on Sensors, 2009. Image sensor 200 includes a blue pixel 204, a green pixel 205, a red pixel 206, and an IR pixel 211. Pixels 204, 205, and 206 include visible spectral filters 245, 255, and 265, respectively, and each of visible spectral filters 245, 255, and 265 is disposed on an IR-cut filter 291. In Kawada et al, IR-cut filter 291 is a multilayer stack of $SiO_2$ and $TiO_2$ thin films, and is not included in a transparent region 295 of an IR pixel 211.

One method for fabricating image sensor 200 requires masking IR pixels 211 when forming IR-cut filter 291 within color pixels 204, 205, and 206. An alternative method of fabricating image sensor 200 involves forming IR-cut filter 291 within all pixels 245, 255, 265, and 211 (visible and IR), and then removing regions of IR-cut filter 291 above the photodiode regions of IR pixels 211 using, for example, a photolithographic patterning process. However, as pixel dimensions become smaller the processes involved with photolithographic patterning become more challenging.

SUMMARY OF THE INVENTION

This disclosure presents a method for reducing IR contamination in VIS-IR CMOS-based dual-mode image sensors that requires neither masking pixels when depositing an IR-cut filter, nor patterning of an IR-cut filter.

The method results in a dual-mode image sensor with a signal-separating color filter array (CFA). The dual-mode image sensor includes a substrate including a plurality of photodiode regions and a plurality of tall spectral filters having a uniform first height and for transmitting a first electromagnetic wavelength range. Each of the plurality of tall spectral filters is disposed on the substrate and aligned with a respective one of the plurality of photodiode regions. The image sensor also includes a plurality of short spectral filters for transmitting one or more spectral bands within a second electromagnetic wavelength range. Each of the plurality of short spectral filters is disposed on the substrate and aligned with a respective one of the plurality of photodiode regions. The image sensor also includes a plurality of single-layer blocking filters for blocking the first electromagnetic wavelength range. Each of the plurality of single-layer blocking filters is disposed on a respective one of the plurality of short spectral filters. Each single-layer blocking filter and its respective short spectral filter have a combined height substantially equal to the first height.

A method for fabricating a signal-separating CFA is also disclosed. The method includes forming a multi-height CFA on a substrate. The multi-height CFA includes a plurality of tall spectral filters and a plurality of short spectral filters. Each of the tall spectral filters is taller than each of the short spectral filters. The method includes disposing a spectral-blocking layer on the multi-height CFA; and planarizing the spectral-blocking layer to expose a top surface of each of the plurality of tall spectral filters.

DETAILED DESCRIPTION

Figure 3:
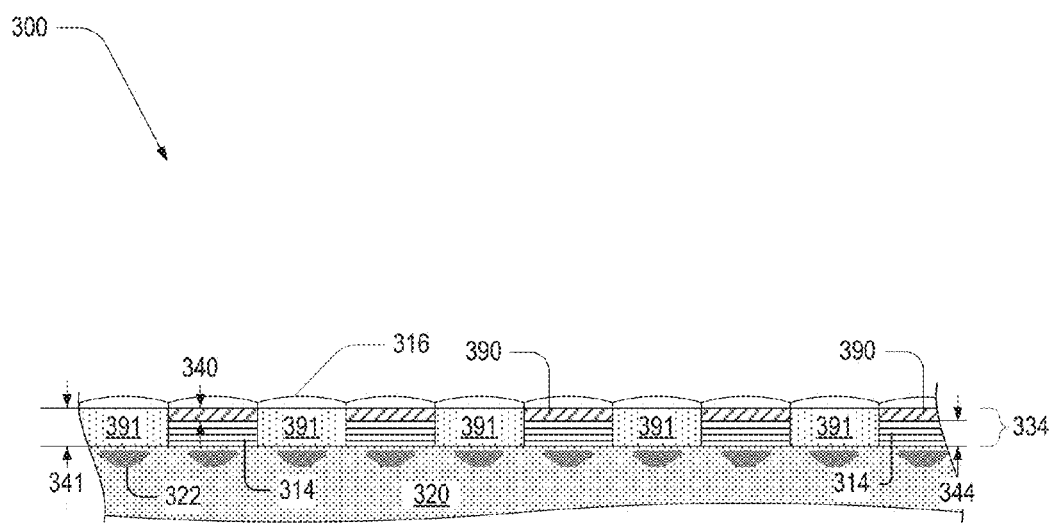
FIG. 3 is a cross-sectional view of a dual-mode image sensor with a signal-separating CFA for visible and IR imaging, in an embodiment.

FIG. 3 is a cross-sectional view of an exemplary dual-mode image sensor 300 with a signal-separating CFA 334 for visible and IR imaging. Dual-mode image sensor 300 includes an array of pixel microlenses 316 disposed on signal-separating CFA 334, which is disposed on a substrate 320. Microlenses 316 are transparent to visible and IR light, and may be formed of materials known in the art. Microlenses 316 may be formed by a reflow process, an embossing replication process, or other methods known in the art.

Signal-separating CFA 334 includes visible spectral filters 314 and IR-pass filters 391. Substrate 320 includes photodiode regions 322 and is formed of a semiconductor such as silicon. Substrate 320 may include layers and regions of different materials without negating its function as a substrate for filters 314 and 391.

Herein, the terms "spectral filter" and "color filter" are synonymous. A spectral filter with a pass band in the visible portion of the electromagnetic spectrum is called a visible spectral filter or visible filter. Similarly, a spectral filter with a pass band in the IR portion of the electromagnetic spectrum is called an IR spectral filter or IR filter. An array of spectral filters containing both visible and IR spectral filters is referred to as a CFA.

The CFA pattern of signal-separating CFA 334 may be a modified Bayer pattern where half of the green filters are replaced by IR-pass filters 391. Candidates for IR-pass filters 391 include Color Mosaic® materials by Fujifilm Corporation, such as the IR pass filter described in WIPO publication numbers WO2014084147 and WO2014103628.

As FIG. 3 is a cross-sectional view along a Bayer pattern row or column, visible spectral filters 314 are either all blue filters or all red filters, depending on the particular row or column corresponding to the cross-sectional view of FIG. 3. Other CFAs using primary-color filters (RGB), such as those described in by R. Lukac (IEEE Trans. Consum. Electr., 51, 4, 2005), may be modified to incorporate IR spectral filters without departing from the scope hereof. In such an embodiment, each visible spectral filter 314 in the cross-sectional view of FIG. 3 need not be the same type of filter, but may be one of a red, a green, or a blue spectral filter. Similarly, CFAs that include secondary-color filters (CMY), visibly clear filters, primary color filters, and combinations thereof may be modified to incorporate IR spectral filters without departing from the scope hereof.

Dual-mode image sensor 300 also includes pixel-localized IR-cut filters 390 between visible spectral filters 314 and their corresponding pixel microlenses 316. Pixel-localized IR-cut filters 390 are for example formed of a single-layer of material. Pixel-localized IR-cut filters 390 may be formed of materials known in the art, such as Color Mosaic® materials by Fujifilm Corporation. Candidate IR-cut filter materials described in the patent literature include materials containing one or more of a resin, a UV-curable resin, a metal oxide, and dyes, such as those described in WIPO publication numbers WO2014104136 and WO2014104137 by Fujifilm Corporation, U.S. Pat. No. 5,807,511 by Kunimatsu and Yamazaki, and U.S. Pat. No. 6,191,884 by Takizawa and Takahashi. For clarity of illustration, not all visible spectral filters 314, pixel microlenses 316, photodiode regions 322, or pixel-localized IR-cut filters 390 are labeled in FIG. 3.

An appropriate height 340 of pixel-localized IR-cut filters 390 may be determined by the Beer-Lambert law: $I(z) = I_0 e^{-4\pi n z / \lambda_0}$, where $I(z)$ is the light intensity after propagating a distance z in the filter, $I_0$ is the incident light intensity, n, is the imaginary part of the IR-cut filter's refractive index, and $\lambda_0$ is the free-space light wavelength.

Each of IR-pass filters 391 has an equal height 341 such that the top surfaces of the IR-pass filters are coplanar. Height 341 exceeds a height 344 of visible spectral filters 314. IR-cut filters have height 340 such that the sum of height 344 of visible spectral filters 314 and height 340 of pixel-localized IR-cut filters 390 is substantially equal to (i.e., between 90% and 110% of) the height 341 of IR-pass filters 391. In an embodiment, height 341 is between 1.0 µm and 1.4 µm and height 344 is between 0.5 µm and 0.7 µm. In an embodiment, the heights of visible spectral filters 314, pixel-localized IR-cut filters 390, and IR-pass filters 391, may be 0.7 µm, 0.5 µm, and 1.2 µm, respectively.

Within signal-separating CFA 334, the heights 340 and 344 may vary while satisfying the following two constraints: For a given visible spectral filter 314 (with height 344) and IR-cut filter 390 (with height 340) disposed thereon, (1) the sum of heights 344 and 340 is substantially equal to IR-pass filter height 341, and (2) height 341 exceeds height 344.

Figure 1:
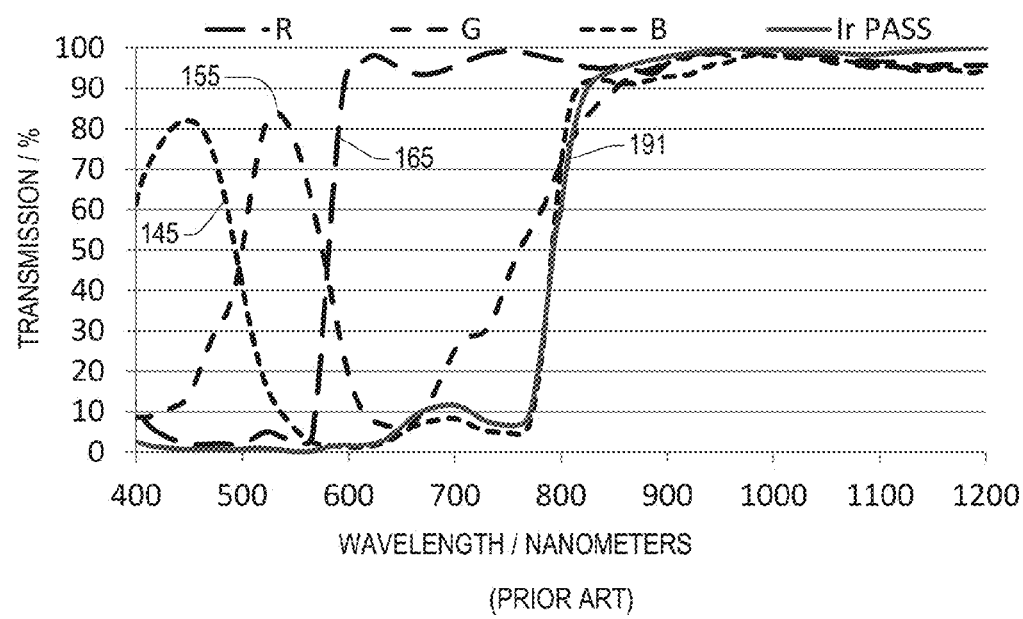
FIG. 1 shows representative transmission spectra of visible and IR spectral filters used in CMOS image sensors.
Figure 2:
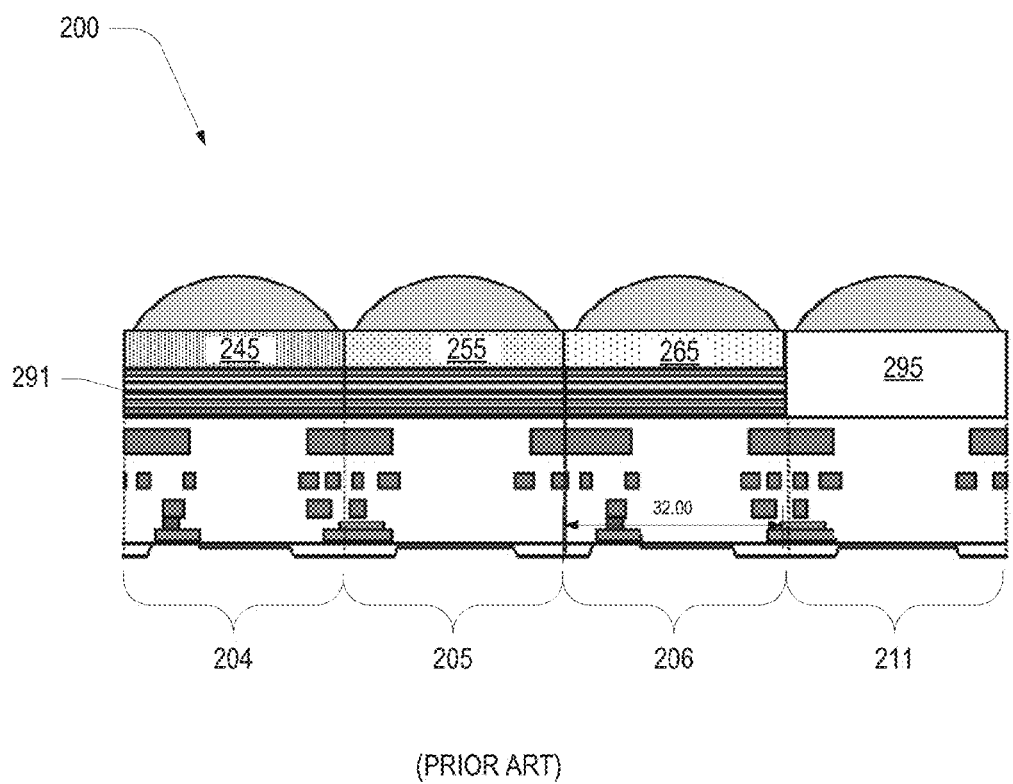
FIG. 2 is a cross-sectional view of a representative prior-art VIS-IR image sensor 200 with reduced IR contamination.
Figure 4:
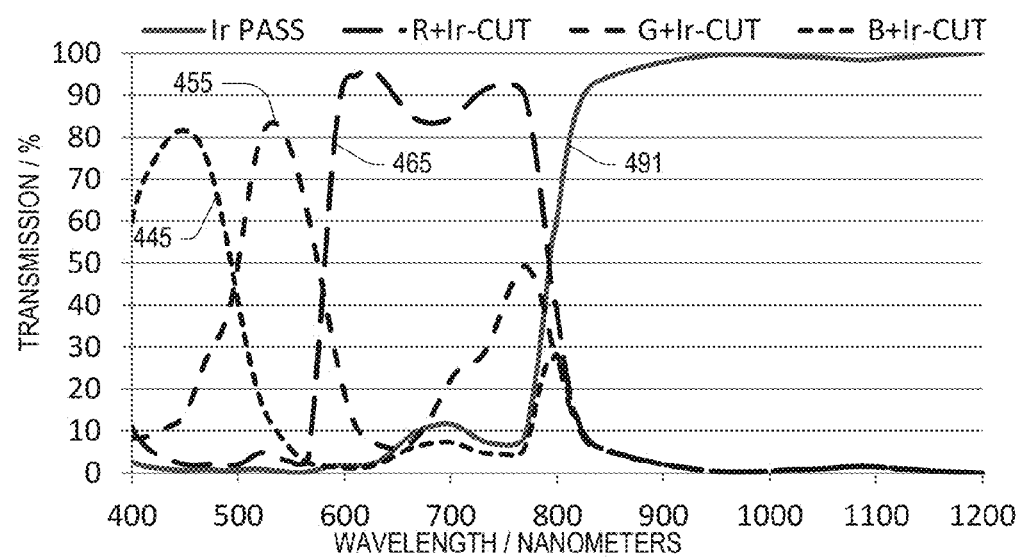
FIG. 4 shows representative transmission spectra of blue, green, red, and IR spectral filters of a signal-separating CFA, in an embodiment.

FIG. 4 shows representative transmission spectra 445, 455, 465, and 491 of blue, green, red, and IR spectral filters, respectively of a signal-separating CFA 334. At visible wavelengths the transmission spectra 445, 455, and 465 resemble transmission spectra 145, 155, and 165 of FIG. 1, respectively. Beyond $\lambda \approx 0.8$ µm, pixel-localized IR-cut filters 390 suppress transmission of the blue, green, and red filters, as shown by transmission spectra 445, 455, and 465, respectively.

Figure 5:
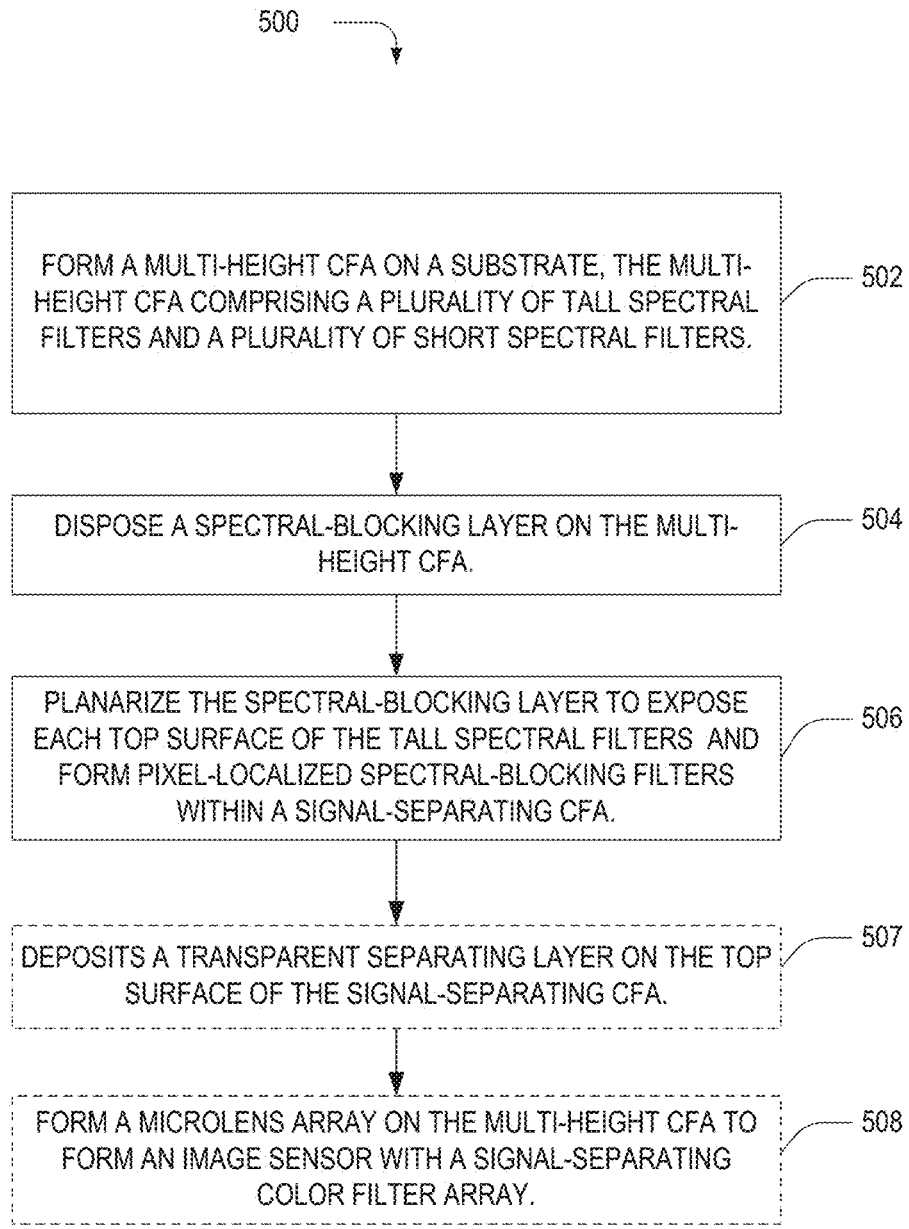
FIG. 5 is a flowchart illustrating a method for fabricating a signal-separating CFA, in an embodiment.
Figure 6:
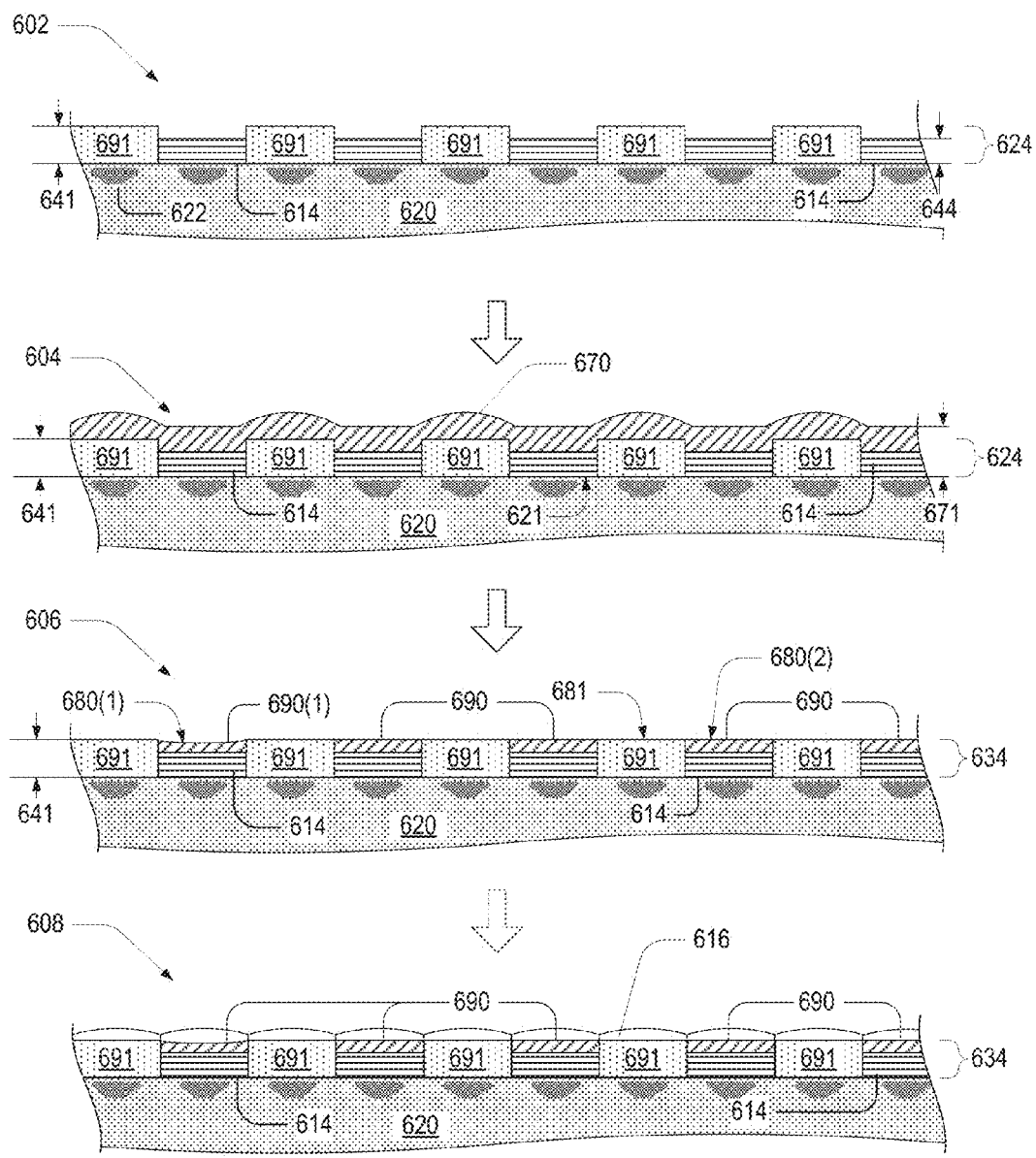
FIG. 6 shows cross-sectional views of CFAs on a substrate, the views corresponding to steps of the method of FIG. 5, in an embodiment.

FIG. 5 is a flowchart illustrating an exemplary method 500 for fabricating a signal-separating CFA. FIG. 6 shows cross-sectional views of CFAs on a substrate, the views corresponding to steps of method 500. FIG. 5 and FIG. 6 are best viewed together with the following description.

In step 502, method 500 forms a multi-height CFA on a substrate. The multi-height CFA includes a plurality of tall spectral filters and a plurality of short spectral filters. Each tall spectral filter is "tall" by virtue of having a height that exceeds any height of a "short" spectral filter. In an example of step 502, method 500 forms a multi-height CFA 624 on a substrate 620, as shown in cross-sectional view 602, FIG. 6.

Multi-height CFA 624 includes visible spectral filters 614, each with a height 644, and IR-pass filters 691, each with a height 641 that exceeds height 644. Visible spectral filters 614 are similar to visible spectral filters 314. Substrate 620 is similar to substrate 320, and includes photodiode regions 622. Each color filter of multi-height CFA 624 is aligned to, e.g., centered above, a respective photodiode region 622.

Step 502 may involve methods and materials used for forming CFAs known in the art. These methods and materials include those described in the following patents: U.S. Pat. No. 4,239,842 to Sandhu, U.S. Pat. No. 4,565,756 to Needs and Blok, U.S. Pat. No. 5,059,500 to Needham, Chiulli, and Clark, U.S. Pat. No. 5,268,245 to Chiulli, U.S. Pat. No. 5,321,249 to Nomura, and U.S. Pat. No. 6,004,704 to Ko. Spectral filter materials for image sensors may also include Color Mosaic® materials by Fujifilm Corporation.

In step 504, method 500 disposes a spectral-blocking layer on the multi-height CFA. In an example of step 504, method 500 disposes an IR-cut layer 670 on the multi-height CFA 624, as shown in cross-sectional view 604, FIG. 6. Before the planarization of step 506, IR-cut layer 670 has a minimum height 671 above a substrate top surface 621 that equals or exceeds height 641 of IR-pass filters 691. IR-cut layer 670 has, for example, a stop band at wavelengths between 0.75 μm and 1.1 μm and is formed of the same material as pixel-localized IR-cut filters 390, FIG. 3. Step 504 may employ a thin-film deposition technique known in the art.

In step 506, method 500 planarizes the spectral-blocking layer to expose top surfaces of the tallest spectral filters in the multi-height CFA and form pixel-localized spectral-blocking filters within a signal-separating CFA. In an example of step 506, method 500 planarizes IR-cut layer 670 to expose top surfaces 681 of IR-pass filters 691 and form pixel-localized IR-cut filters 690 within a signal-separating CFA 634, as shown in cross-sectional view 606. Signal-separating CFA 634 is an embodiment of signal-separating CFA 334. Each IR-pass filter 691 has a top surface 681, of which just one is shown in cross-sectional view 606 for clarity. Step 506 may be performed with blanket-etching, chemical mechanical planarization (a.k.a. chemical mechanical polishing), or other planarization methods known in the art.

In step 506, exposing the surfaces of the tallest filters in the signal-separating CFA may result in the IR-cut filters having a non-planar top surface without departing from the scope hereof. For example, in cross-sectional view 606, pixel-localized IR-cut filter 690(1) has a concave top surface 680(1), whereas the other pixel-localized IR-cut filters 690 each have a flat top surface, for example, a top surface 680(2).

In optional step 507, method 500 deposits a transparent separating layer on the top surface of the signal-separating CFA. The transparency of the separating layer to visible and IR light is similar to that of the microlenses 316. In an example of step 507, method 500 deposits a transparent separating layer, not shown in FIG. 6, on top surfaces 680 and 681 of signal-separating CFA 634. The transparent separating layer may be considered part of signal-separating CFA 634.

In optional step 508, method 500 forms a microlens array on the signal-separating CFA to form a dual-mode image sensor with a signal-separating color filter array. Each microlens of the microlens array is axially aligned to a respective individual filter of the signal-separating CFA. In an example of step 508, method 500 forms an array of microlenses 616 on signal-separating CFA 634, which results in a dual-mode image sensor 608. Microlenses 616 are similar to microlenses 316 of FIG. 3.

In an embodiment of method 500 that includes optional step 507, the transparent separating layer separates the bottom surfaces of microlenses 616 and top surfaces 680 and 681. The transparent separating layer may function to optimize the focus of each microlens 616 with respect to each respective photodiode region 622.

Dual-mode image sensor 608 and signal-separating CFA 634 are similar to dual-mode image sensor 300 and signal-separating CFA 334, respectively. Each microlens 616 is an axially aligned to a respective individual spectral filter 614 or 691 of signal-separating CFA 634.

Figure 7:
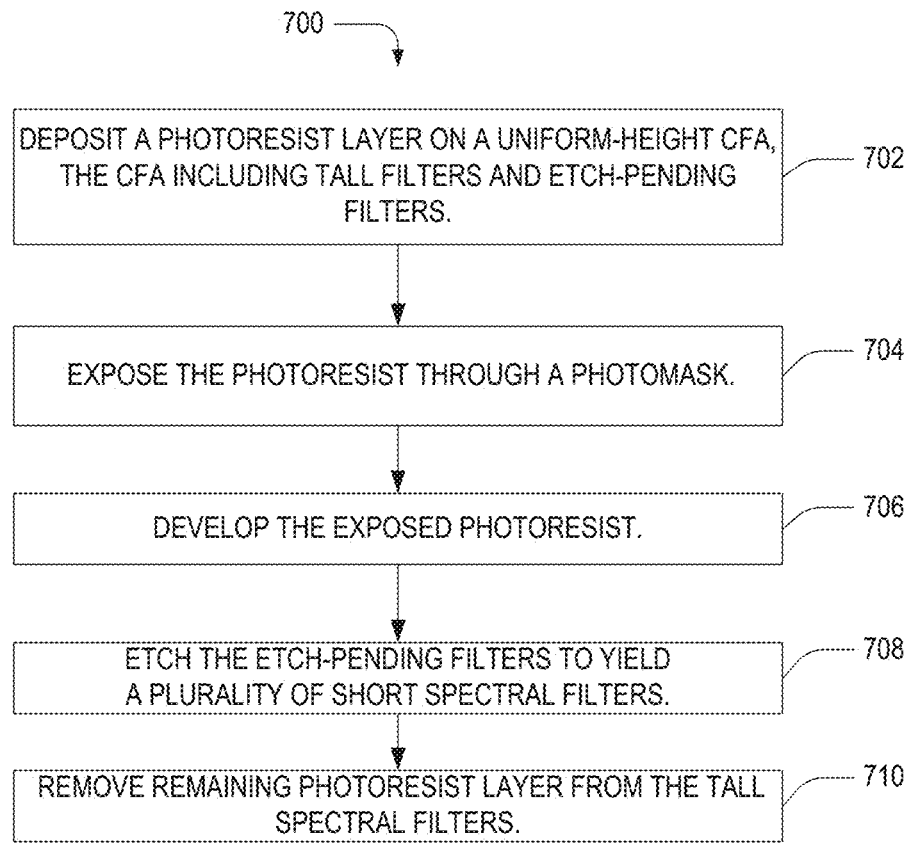
FIG. 7 is a flowchart illustrating a first method for fabricating a multi-height CFA, in an embodiment.
Figure 8:
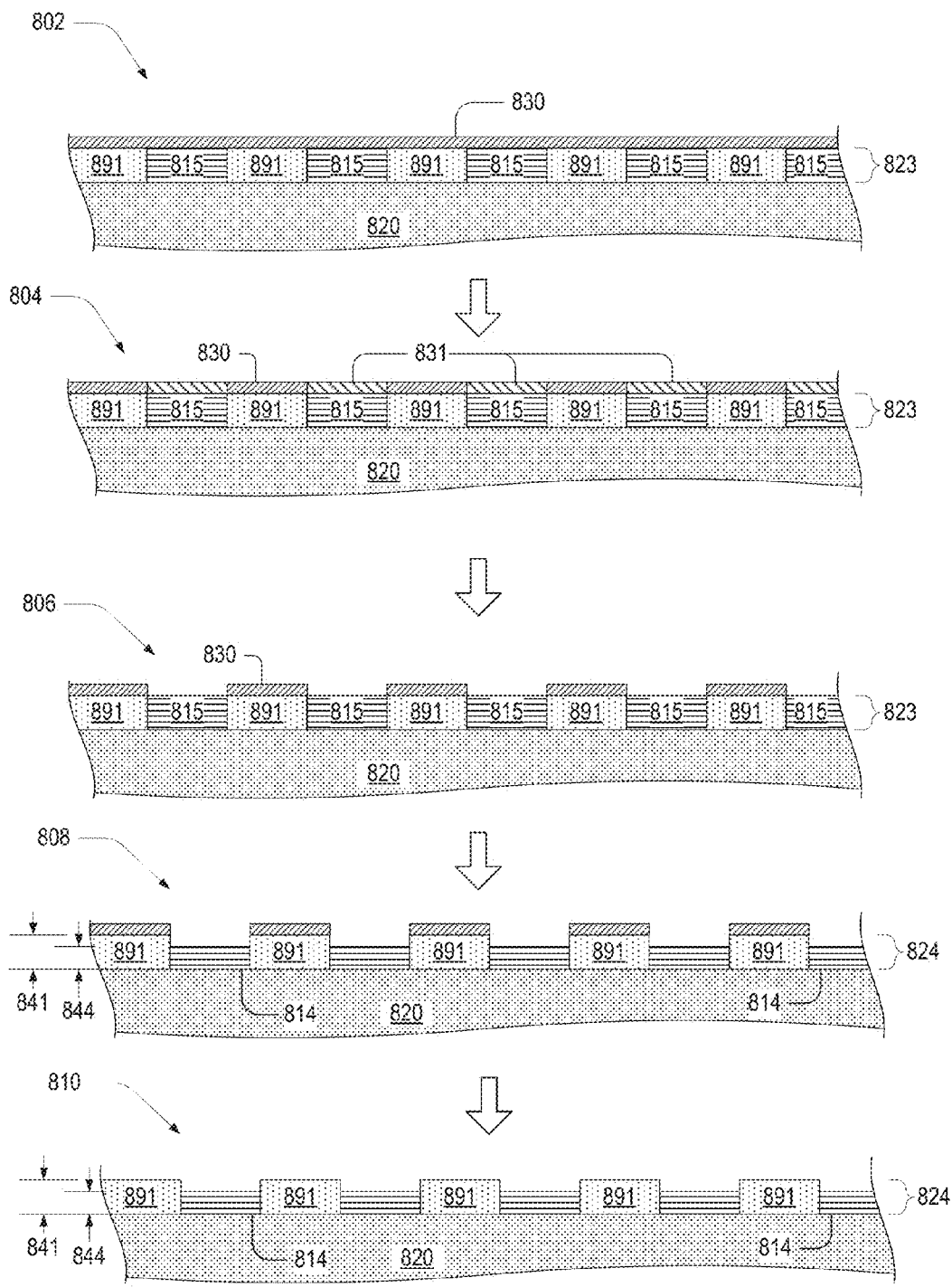
FIG. 8 shows cross-sectional views of CFAs on a substrate, the views corresponding to steps of the method of FIG. 7, in an embodiment.

FIG. 7 is a flowchart illustrating a first exemplary method 700 for fabricating a multi-height CFA, for example, the multi-height CFA of method 500, step 502, and multi-height CFA 624, FIG. 6. Method 700 is involves photolithographically processing a uniform-height CFA. A uniform-height CFA is a standard CFA used in the art with color filters of equal height, to within fabrication tolerances. FIG. 8 shows cross-sectional views of CFAs on a substrate, the views corresponding to steps of method 700. FIG. 7 and FIG. 8 are best viewed together with the following description.

In step 702, method 700 deposits a photoresist layer on a uniform-height CFA. For the purpose of describing method 700, the color filters within the uniform-height CFA are categorized into two groups: tall filters and etch-pending filters.

In an example of step 702, method 700 deposits a photoresist layer 830 on a uniform-height CFA 823. Uniform-height CFA 823 is disposed on a substrate 820, as shown by cross-sectional view 802, FIG. 8. Uniform-height CFA 823 includes two categories of filters: tall spectral filters 891 and etch-pending spectral filters 815. Substrate 820 is similar to substrate 320, FIG. 3.

In step 704, method 700 exposes the photoresist layer through a photomask, the photomask blocking photoresist regions disposed on the tall filters and having apertures aligned with the etch-pending filters. In an example of step 704, method 700 exposes photoresist layer 830, resulting in exposed photoresist regions 831 covering etch-pending spectral filters 815, as shown by cross-sectional view 804.

In step 706, method 700 develops the exposed photoresist regions to remove exposed photoresist regions on each of the etch-pending filters. In an example of step 706, method 700 develops exposed photoresist regions 831 to remove photoresist regions on each of the etch-pending spectral filters 815, as shown by cross-sectional view 806.

In step 708, method 700 etches the etch-pending filters to yield a plurality of short spectral filters. In an example of step 708, method 700 etches etch-pending spectral filters 815 to a height 844, which results in short spectral filters 814, as shown in cross-sectional view 808. Height 844 is smaller than a height 841 of each tall spectral filter 891.

In step 710, method 700 removes remaining photoresist layer from the tall spectral filters. In an example of step 710, method 700 removes remaining photoresist layer 830 from tall spectral filters 891, as shown in cross-sectional view 810. Short spectral filters 814 and tall spectral filters 891 constitute a multi-height CFA 824.

Figure 9:
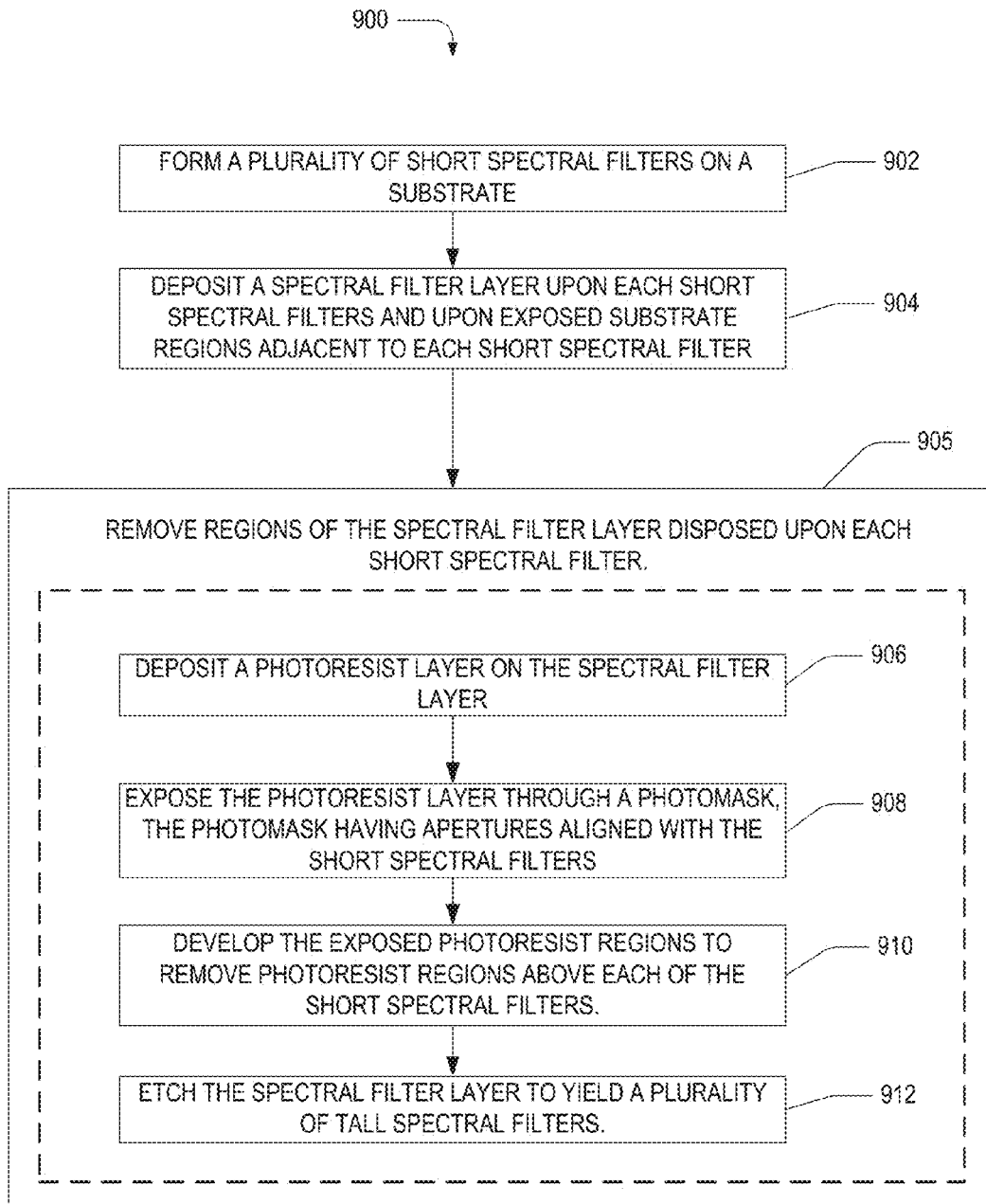
FIG. 9 is a flowchart illustrating a second method for fabricating a multi-height CFA, in an embodiment.
Figure 10:
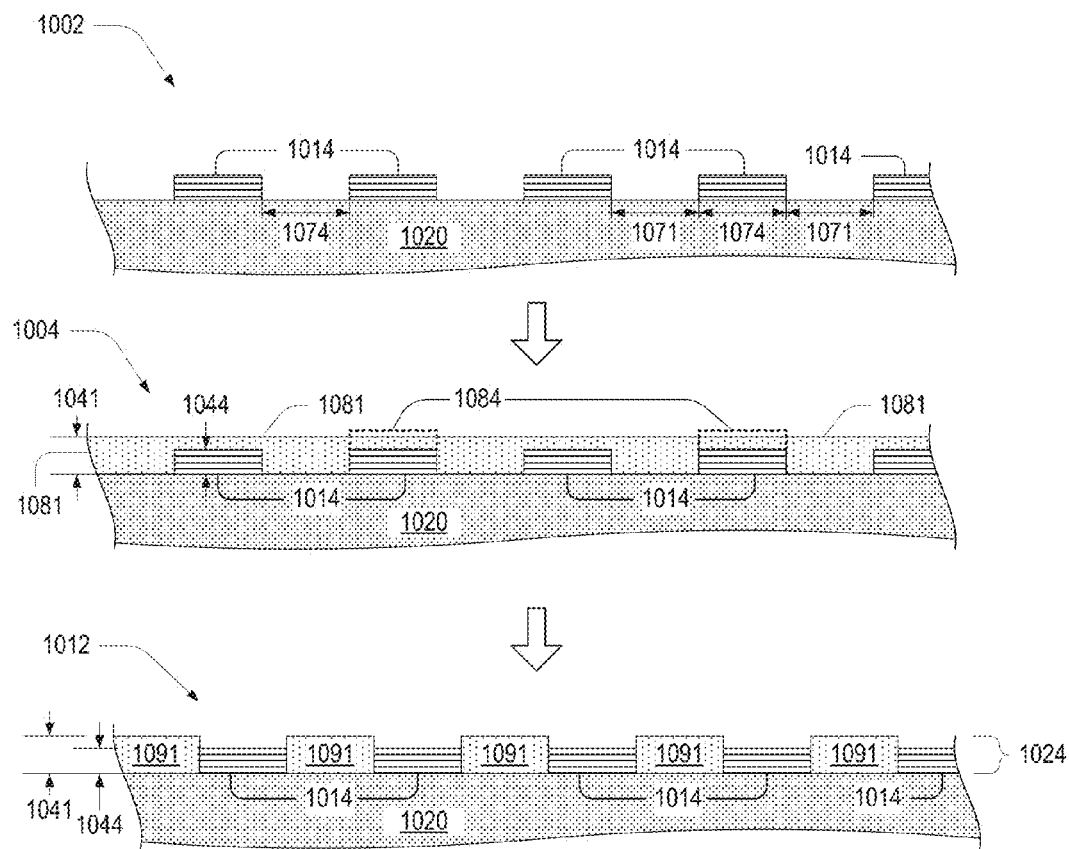
FIG. 10 shows cross-sectional views of CFAs on a substrate, the views corresponding to steps of the method of FIG. 9, in an embodiment.

FIG. 9 is a flowchart illustrating a second exemplary method 900 for fabricating a multi-height CFA. FIG. 10 shows cross-sectional views of color filter arrays on a substrate, the views corresponding to steps of method 900. FIG. 9 and FIG. 10 are best viewed together with the following description.

In step 902, method 900 forms a plurality of short spectral filters on a substrate. In an example of step 902, method 900 forms an array of short spectral filters 1014 on a substrate 1020, as shown in cross-sectional view 1002, FIG. 10. Spectral filters 1014 are designated as "short" to distinguish them from "tall" filters, formed in subsequent steps of this method, which are taller than short spectral filters 1014.

In cross-sectional view 1002, distances 1071 between adjacent short spectral filters 1014 are equal or substantially equal to a width 1074 of each short spectral filter 1014. Subsequent steps of method 900 will form spectral filters between adjacent short spectral filters 1014.

In step 904, method 900 deposits a spectral filter layer upon each of the plurality of short spectral filters and upon exposed substrate regions adjacent to each of the plurality of the short spectral filters. The height of the spectral filter layer exceeds the height of each short spectral filter, where each height is relative to the plane of the substrate.

In an example of step 904, method 900 deposits a spectral filter layer 1081 upon each short spectral filters 1014 and upon exposed regions of substrate 1020 adjacent to a short spectral filter 1014, as shown by cross-sectional view 1004. Spectral filter layer 1081 has a height 1041 that exceeds a height 1044 of each short spectral filter 1014. In cross-sectional view 1004, selected regions of spectral filter layer 1081 disposed on short spectral filters 1014 are labeled as filter regions 1084.

In step 905, method 900 removes regions of the spectral filter layer disposed upon each of the plurality of short spectral filters. In an example of step 905, method 900 removes regions 1084 of spectral filter layer 1081 disposed upon each of the plurality of short spectral filters 1014 to form tall spectral filters 1091 as shown in cross-sectional view 1012. Short spectral filters 1014 and tall spectral filters 1091 constitute a multi-height CFA 1024.

Figure 11:
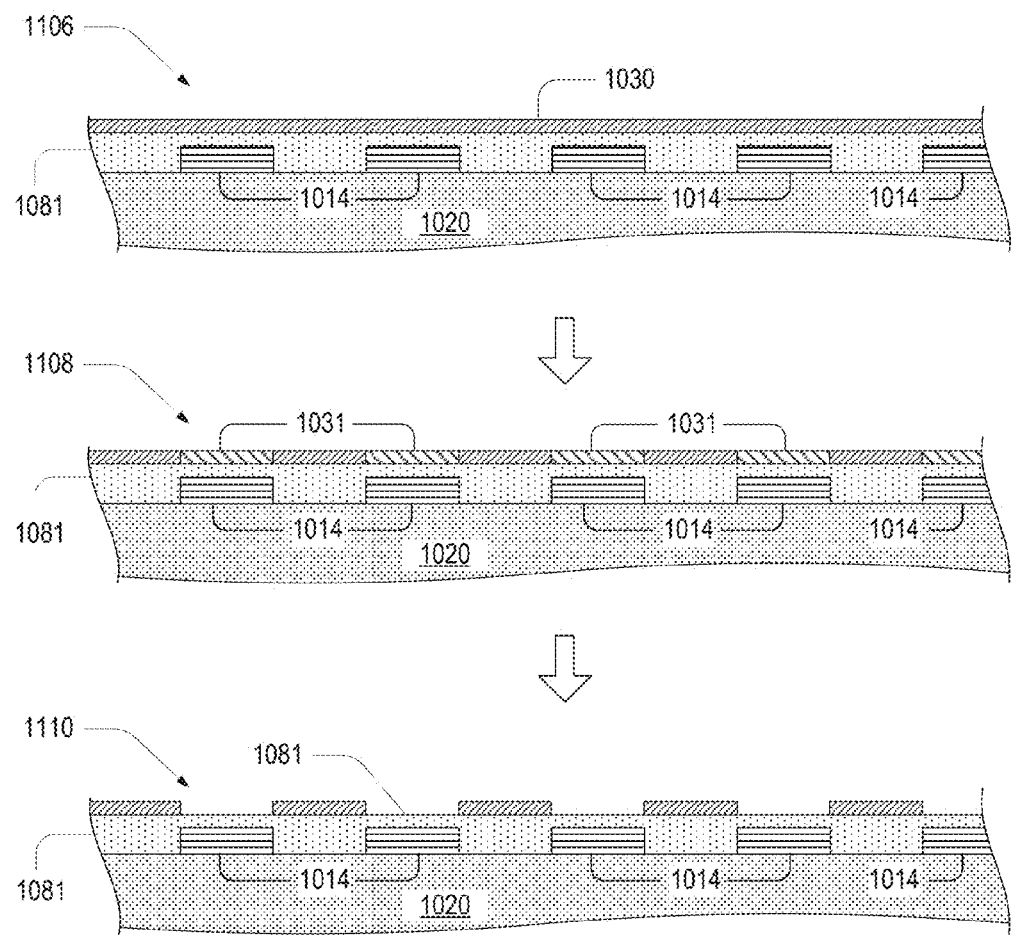
FIG. 11 shows cross-sectional views of CFAs on a substrate, the views corresponding to steps of the method of FIG. 9, in an embodiment.

In an embodiment of method 900, step 905 includes steps 906, 908, 910, and 912, described below. FIG. 11 shows cross-sectional views of color filter arrays on a substrate, the views corresponding to steps 906, 908, and 910. FIG. 9 and FIG. 11 are best viewed together with the following description.

In step 906, method 900 deposits a photoresist layer on the spectral filter layer. In an example of step 906, method 900 deposits a photoresist layer 1030 on spectral filter layer 1081, as shown by cross-sectional view 1106, FIG. 11.

In step 908, method 900 exposes the photoresist layer through a photomask, the photomask having apertures aligned with the short spectral filters. In an example of step 908, method 900 exposes photoresist layer 1030, resulting in exposed photoresist regions 1031 covering respective short spectral filters 1014, as shown by cross-sectional view 1108.

In step 910, method 900 develops the exposed photoresist regions to remove photoresist regions above each of the short spectral filters. In an example of step 910, method 900 develops exposed photoresist regions 1031 to remove photoresist regions above each of the short spectral filters 1014, as shown by cross-sectional view 1110.

In step 912, method 900 etches the spectral filter layer to yield a plurality of tall spectral filters. In an example of step 912, method 900 etches spectral filter layer 1081 to yield a plurality of tall spectral filters 1091, as shown by cross-sectional view 1012, FIG. 10. Short spectral filters 1014 have a height 1044, which is smaller than height 1041 of tall spectral filters 1091. Tall spectral filters 1091 and short spectral filters 1014 constitute a multi-height CFA 1024.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A dual-mode image sensor with a signal-separating color filter array comprising:
    a substrate including a plurality of photodiode regions;
    a plurality of tall spectral filters having a uniform first height and for transmitting a first electromagnetic wavelength range, each of the plurality of tall spectral filters disposed on the substrate and aligned with a respective one of the plurality of photodiode regions;
    a plurality of short spectral filters for transmitting one or more spectral bands within a second electromagnetic wavelength range, each of the plurality of short spectral filters disposed on the substrate and aligned with a respective one of the plurality of photodiode regions; and
    a plurality of single-layer blocking filters for blocking the first electromagnetic wavelength range, each of the plurality of single-layer blocking filters (i) having a minimum thickness exceeding 0.5 µm and (ii) being disposed on a respective one of the plurality of short spectral filters, each single-layer blocking filter and its respective short spectral filter having combined height substantially equal to the first height.

2. The dual-mode image sensor of claim 1, the first electromagnetic wavelength range corresponding to infrared electromagnetic radiation.

3. The dual-mode image sensor of claim 1, the second electromagnetic wavelength range corresponding to visible electromagnetic radiation.

4. The dual-mode image sensor of claim 3, the number of spectral bands exceeding one and each spectral band denoting an electromagnetic wavelength range corresponding to a different primary color.

5. The dual-mode image sensor of claim 1, the uniform first height being between 1.0 micrometers and 1.4 micrometers inclusive, and each of the plurality of short spectral filters having a height between 0.5 micrometers and 0.7 micrometers inclusive.

6. The dual-mode image sensor of claim 1, further comprising a separating layer disposed between a microlens array of the image sensor and a surface formed by the plurality of tall spectral filters and the plurality of single-layer blocking filters, the separating layer being transparent to both visible and infrared wavelength ranges.

7. A signal-separating color filter array (CFA) comprising:
a plurality of tall spectral filters disposed on a substrate and having a uniform first height, the plurality of tall spectral filters for transmitting a first electromagnetic wavelength range;
a plurality of short spectral filters disposed on the substrate, the plurality of short spectral filters for transmitting one or more spectral bands within a second electromagnetic wavelength range; and
a plurality of single-layer blocking filters for blocking the first electromagnetic wavelength range, each of the plurality of single-layer blocking filters (i) having a minimum thickness exceeding 0.5 µm and (ii) being disposed on a respective one of the plurality of short spectral filters, each single-layer blocking filter and its respective short spectral filter having combined height substantially equal to the first height.

8. The signal-separating CFA of claim 7, the first electromagnetic wavelength range corresponding to infrared electromagnetic radiation.

9. The signal-separating CFA of claim 7, the second electromagnetic wavelength range corresponding to visible electromagnetic radiation.

10. The signal-separating CFA of claim 9, the number of spectral bands exceeding one and each spectral band denoting an electromagnetic wavelength range corresponding to a different primary color.

11. The signal-separating CFA of claim 7, the uniform first height being between 1.0 micrometers and 1.4 micrometers inclusive, and each of the plurality of short spectral filters having a height between 0.5 micrometers and 0.7 micrometers inclusive.

\* \* \* \* \*